United States Patent [19]
Hoshi

[11] Patent Number: 5,939,754
[45] Date of Patent: Aug. 17, 1999

[54] POWER MOSFET HAVING A DRAIN HETEROJUNCTION

[75] Inventor: Masakatsu Hoshi, Yokohama, Japan

[73] Assignee: Nissan Motor Co., Ltd., Yokohama, Japan

[21] Appl. No.: 08/925,048

[22] Filed: Sep. 8, 1997

[30] Foreign Application Priority Data

Sep. 9, 1996 [JP] Japan ................................. 8-237437

[51] Int. Cl.[6] .................................................. H01L 29/68
[52] U.S. Cl. ........................... 257/342; 257/77; 257/192; 257/342; 257/343; 257/401
[58] Field of Search .......................... 257/77, 192, 339, 257/342–343, 493, 401

[56] References Cited

U.S. PATENT DOCUMENTS

| | | | |
|---|---|---|---|
| 4,890,142 | 12/1989 | Tonnel et al. ........................ | 257/343 |
| 4,980,303 | 12/1990 | Yamauchi ............................ | 438/235 |
| 4,990,982 | 2/1991 | Omoto et al. ....................... | 257/409 |
| 5,510,275 | 4/1996 | Malhi ................................... | 438/285 |
| 5,734,180 | 3/1998 | Malhi ................................... | 257/77 |

FOREIGN PATENT DOCUMENTS 2 306 250   4/1997   United Kingdom .

OTHER PUBLICATIONS

Patent Abstract No. 63–47987 p. 16 E 637, Feb. 1988.

*Primary Examiner*—John Guay
*Attorney, Agent, or Firm*—Foley & Lardner

[57] ABSTRACT

There is provided a power MOSFET in which a plurality of base regions are formed on a surface of a semiconductor region serving as a drain region, convex drain regions are formed on the semiconductor region, and a part of the convex drain regions is formed of wide bandgap semiconductor having a bandgap wider than that of the semiconductor region. The wide bandgap semiconductor is connected to the drain electrodes and a part of the convex drain regions has a structure sandwiched by gate electrodes. If the semiconductor region is formed of silicon, silicon carbide (SiC) is representatively preferable material as the wide bandgap semiconductor.

21 Claims, 13 Drawing Sheets

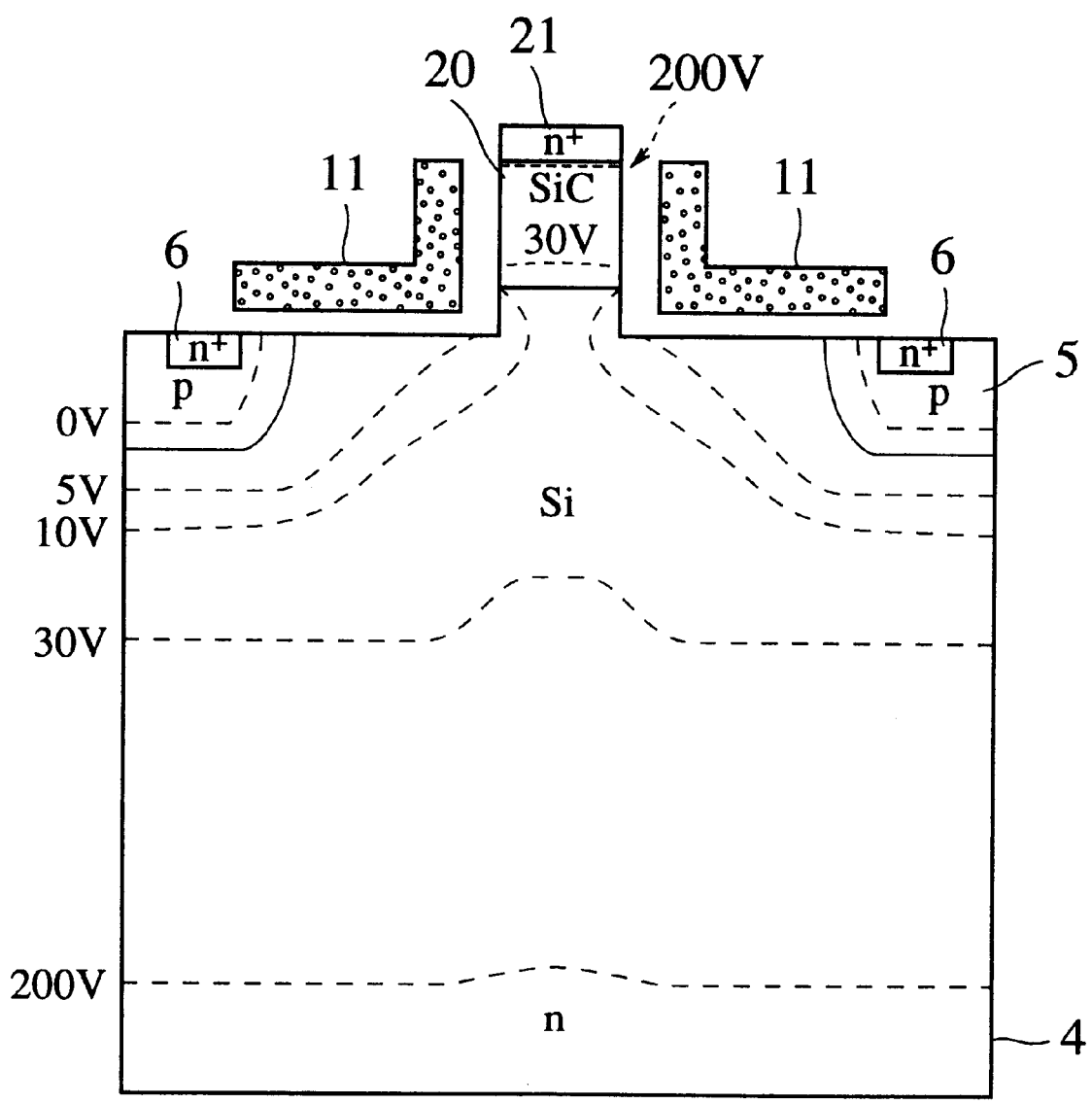

POWER MOSFET HAVING A DRAIN HETEROJUNCTION

BACKGROUND OF THE INVENTION

1. Field of the Invention

The present invention relates to a field effect transistor and, more particularly, provides a technology directed toward lowering the on-resistance of a power MOSFET having a high breakdown voltage.

2. Description of the Prior Art

As a lateral power MOSFET in the prior art, a structure shown in FIG. 1, for example, has been known. In FIG. 1, a high impurity concentration n$^+$-type Si buried layer 3 is formed between a p-type silicon (abbreviated as "Si" hereinafter) substrate 1 and a p-type Si epitaxial layer 2. An n-type Si drain region 4 is formed in the p-type Si epitaxial layer 2 to be connected to the high impurity concentration n$^+$-type Si buried layer 3. P-type Si base regions (channel regions) 5 and a high impurity concentration n$^+$-type Si drain region 18 are formed in the n-type Si drain region 4. High impurity concentration n$^+$-type Si source regions 6 are formed in the p-type Si base region 5. A gate electrode 11 made of polysilicon is formed on the p type Si base region 5 and a part of the n-type Si drain region 4 via a gate oxide film 7. In addition, a source electrode 12 is formed to be isolated from the gate electrode 11 by a first interlayer film 9. A drain electrode 13 is formed to be isolated from the source electrode 12 by a second interlayer film 10.

In the lateral power MOSFET shown in FIG. 1, if a predetermined potential, e.g., a positive potential is applied to the gate electrode 11 under the condition that a voltage is applied between the drain electrode 13 and the source electrode 12, an n-type inversion layer is formed on a surface of the p-type Si base region 5 immediately below the gate electrode 11 so that a drain current is passed from the drain electrode 13 to the source electrode 12. Conversely, if either 0 V or another predetermined potential, e.g., a negative potential is applied to the gate electrode 11, such n-type inversion layer disappears so that the lateral power MOSFET becomes an OFF state.

However, in the conventional lateral power MOSFET shown in FIG. 1, in order to maintain the breakdown voltage between the drain and the source in the OFF state in excess of a predetermined high value, a concentration of the n-type Si drain region 4 must be reduced and a length between the p type Si base region 5 and the high impurity concentration n$^+$-type Si drain region 18 must be made longer. As a result, a current path becomes longer and the on-resistance is increased. That is to say, there is in general a trade-off relation between the breakdown voltage and the on-resistance of the power MOSFET.

As well known in the art, in a so-called abrupt junction wherein it is supposed that a high impurity concentration p$^+$ type region is connected to an n-type region of relatively low impurity concentration N$_d$ and that a depletion layer is extended only in the n-type region, a breakdown voltage V$_B$ has a relation with an impurity concentration N$_d$, as expressed by Eq.(1) deduced in compliance with a one-dimensional approximation model.

$$N_d = \epsilon E_c^2/(2qV_B) \quad (1)$$

Where, $\epsilon$ is a dielectric constant, q is unit charge, and E$_c$ is a critical electric field. A width W of the depletion layer at breakdown can be expressed by $$W = 2V_B/E_c \quad (2)$$

For contrast, a resistance R$_d$ of a semiconductor region having a unit sectional area and a length W can be given by $$R_d = W/(qN_d\mu_n) \quad (3)$$

Where, $\mu_n$ is the electron mobility in bulk of respective semiconductor materials.

Furthermore, in the case of abrupt junction, it has been known that, with respect to Si, relations given by Eqs.(4) and (5) can be derived approximately for the impurity concentration N$_d$ and the depletion-layer width W respectively.

$$N_d = 2.01 \times 10^{18} V_B^{-4/3} \quad (4)$$

$$W = 2.58 \times 10^{-6} V_B^{7/6} \quad (5)$$

In the conventional example of the lateral power MOSFET shown in FIG. 1, if the power MOSFET of 200 V class, for instance, is explained as an example, the impurity concentration of the n-type Si drain region 4 becomes $1.7 \times 10^{15}$ cm$^{-3}$ based on Eq.(4). In addition, as the distance W between the p type Si base region 5 and the high impurity concentration n$^+$-type Si drain region 18, 12.5 $\mu$m is needed from Eq.(5). At this time, if the electron mobility $\mu_n$ in the Si bulk is assumed to 1340 cm$^2$/V·s, the drain resistance R$_d$ becomes a large value such as $3.4 \times 10^{-3}$ $\Omega$ cm$^2$ from Eq.(3). In fact, since other resistances such as a contact resistance are added to the on-resistance of the power MOSFET, the drain resistance R$_d$ becomes a larger value. In other words, once the distance W between the base region and the drain region and the impurity concentration N$_d$ in the drain region are defined, a structurally determined breakdown voltage and a correlative value of on-resistance can be derived in the power MOSFET in the prior art, both the breakdown voltage and the on-resistance being insufficient respectively.

SUMMARY OF THE INVENTION

The present invention has been made to overcome the above problems and it is an object of the present invention to provide a power MOSFET which is capable of reducing an on-resistance while maintaining a high breakdown voltage between source and drain regions.

It is another object of the present invention to provide a power MOSFET which is capable of achieving a higher drain voltage by dividing an application of a drain voltage into two sub-drain voltages each having rather smaller value.

It is still another object of the present invention to provide a method for manufacturing a power MOSFET which is capable of reducing an on-resistance while maintaining a high breakdown voltage between source and drain regions.

It is yet still another object of the present invention to provide a method for manufacturing a power MOSFET which is capable of easily manufacturing a MOSFET having a high breakdown voltage and a low on-resistance.

In order to achieve the above objects, a first aspect of the present invention is that the power MOSFET having a plurality of base regions, source regions formed in the base regions and a drain region formed between the base regions, wherein the drain region has a convex portion and at least a part of the convex portion is formed of wide bandgap semiconductor which has a wider bandgap rather than other portion. More particularly, the power MOSFET of the present invention has a hetero junction consisting of wide bandgap semiconductor and another semiconductor having a bandgap narrower than that of the wide bandgap semiconductor in the drain region.

As has already explained using Eqs.(1) to (5), there exist predetermined relationships between the breakdown voltage $V_B$ of the MOSFET and the critical electric field $E_c$, the width W of the depletion layer at breakdown, and the resistance $R_d$ of the drain region (referred to as "drain resistance" hereinafter) respectively. Substituting Eqs.(1) and (2) into Eq.(3) yields $$R_d = 4V_B^2/(\epsilon \mu_n E_c^3) \quad (6)$$

It can be seen from Eq.(6) that the more the critical electric field $E_c$, the smaller the drain resistance $R_d$.

In general, the wide bandgap semiconductor has a tendency to exhibit the large critical electric field $E_c$ in contrast to silicon (Eg=1.12 eV). For instance, silicon has about $E_c$=3.7×10$^5$ V/cm while SiC (Eg=3.0 eV) has $E_c$=3×10$^6$ V/cm and diamond (Eg=5.5 eV) has $E_c$=7×10$^6$ V/cm. Therefore, evidently the drain resistance $R_d$ can be reduced if the wide bandgap semiconductor such as SiC, diamond, etc. is employed as the drain region.

In the present invention, since there are provided the convex drain regions and at least a part of the convex drain regions is formed of wide bandgap semiconductor, the higher breakdown voltage and the lower on-resistance can be achieved simultaneously. More particularly, if the drain resistance which is the major component of the on-resistance is made smaller, the lower on-resistance and the higher breakdown voltage can be obtained simultaneously, which cannot be achieved by the power MOSFET in the prior art. In the power MOSFET according to the first aspect of the present invention, a trade-off curve between the breakdown voltage and the on-resistance comes closer to an origin.

In the first aspect of the present invention, it is preferable that the convex portions are formed to be sandwiched in between the gate electrodes via the insulating films so that a maximum electric field point can be located in the wide bandgap semiconductor so as to attain the higher breakdown voltage.

A second aspect of the present invention is concerned with a method for manufacturing the power MOSFET explained in the above first aspect of the present invention. More particularly, the second aspect of the present invention is a method for manufacturing the power MOSFET comprising the steps of (a) on a semiconductor region serving as a drain region, forming a wide bandgap semiconductor layer of same conductivity type as that of the semiconductor region and having a bandgap wider than that of the semiconductor region, and (b) removing a predetermined portion of the wide bandgap semiconductor layer and then forming convex wide bandgap drain regions made of the wide bandgap semiconductor layer in proximity to the semiconductor region. It has been well known that it is difficult to form the pn junction in the wide bandgap semiconductor such as SiC, etc. However, according to the method for manufacturing the power MOSFET, the power MOSFET having the higher breakdown voltage and the lower on-resistance can be manufactured extremely easily since no pn junction is provided in the wide bandgap semiconductor.

Other and further objects and features of the present invention will become obvious an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 3 is a schematic sectional view showing potential distribution when the lateral power MOSFET shown in FIG. 2 is in OFF state;

DETAILED DESCRIPTION OF THE EMBODIMENTS

Figure 1:
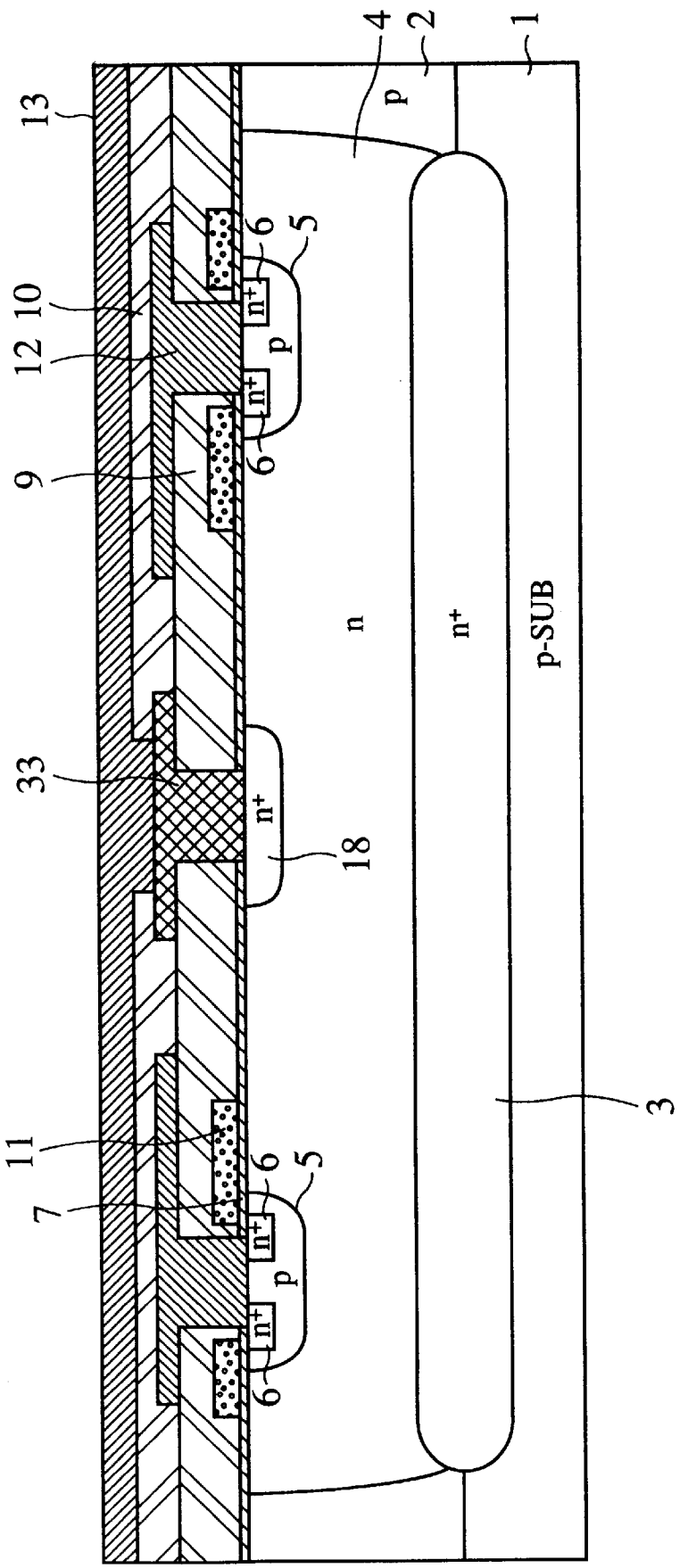
FIG. 1 is a sectional view showing an example of a lateral power MOSFET in the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

FIRST EMBODIMENT

Figure 2:
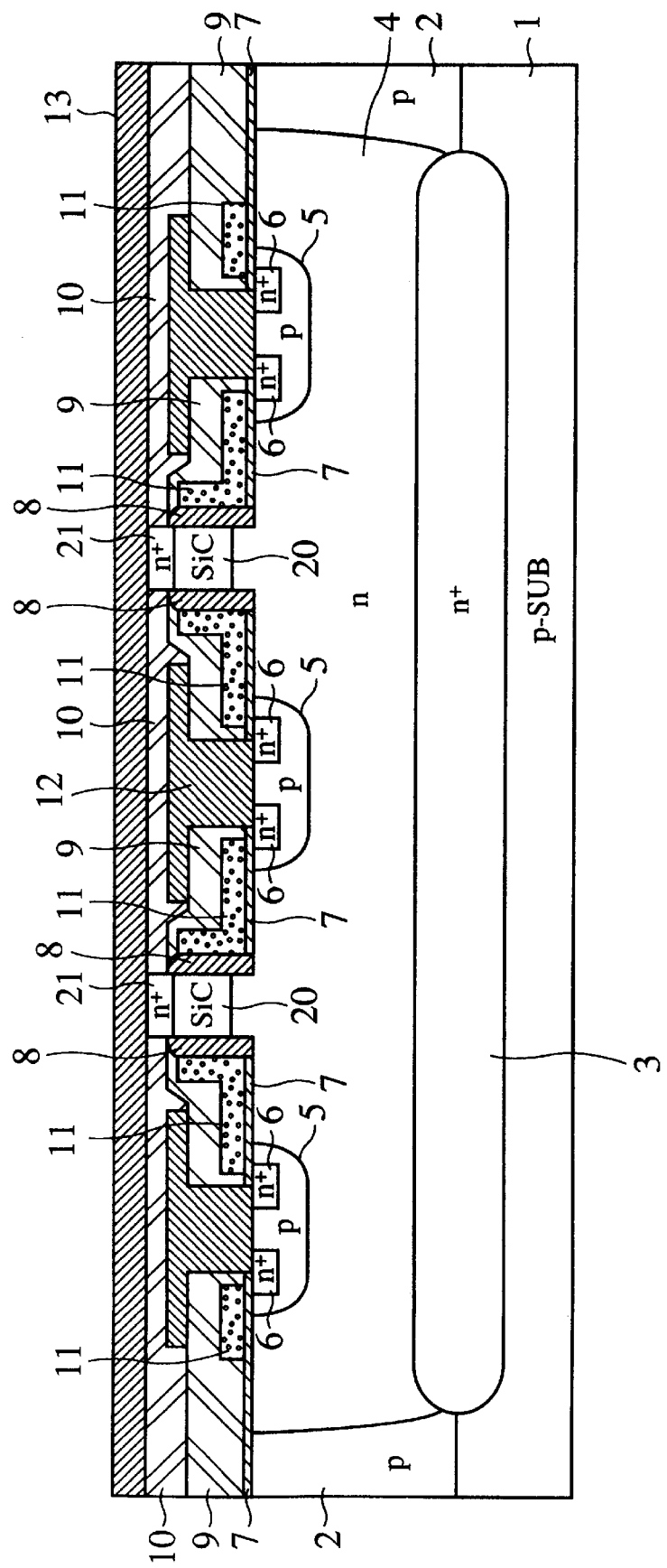
FIG. 2 is a sectional view showing a lateral power MOSFET according to a first embodiment of the present invention.

FIG. 2 is a sectional view showing a lateral power MOSFET according to a first embodiment of the present invention. In the power MOSFET shown in FIG. 1, the high impurity concentration n$^+$-type Si buried layer 3 is formed between the p-type Si substrate 1 and the p-type Si epitaxial layer 2. Further, an n-type semiconductor region acting as an n-type Si drain region 4 is formed in the p-type Si epitaxial layer 2 to be connected to the high impurity concentration n$^+$-type Si buried layer 3. Furthermore, p-type Si base regions 5 are formed in the n-type Si drain region 4. High impurity concentration n$^+$-type Si source regions 6 are formed in respective p-type Si base regions 5. Gate electrodes 11 made of polysilicon are formed on the p type Si base region 5 and a part of the n-type Si drain region 4 via a gate oxide film 7 respectively.

In addition, n-type convex silicon carbide (SiC) drain regions 20 are protruded from the n-type Si drain region 4 to thus constitute wide bandgap drain regions respectively. Insulating films 8 are formed on side walls of n-type convex silicon carbide (SiC) drain region 20 respectively. Thus, each n-type SiC drain region 20 is sandwiched in between the gate electrodes 11 via the insulating films 8. High impurity concentration n$^+$-type SiC drain regions 21 each serving as a wide bandgap contact region are formed on top surfaces of the n-type SiC drain regions 20 respectively. A first interlayer insulating film 9 is formed on the gate electrodes 11. Source electrodes 12 are formed on the first interlayer insulating film 9. Respective source electrodes 12 are also brought into contact with the n$^+$-type Si source regions 6 and the p-type Si base region 5 via contact holes formed in the first interlayer Insulating film 9. A second interlayer insulating film 10 is formed on the source electrodes 12. A drain electrode 13 is formed on the second interlayer insulating film 10. The n-type SiC drain regions 20 are connected to the drain electrode 13 via the high impurity concentration n$^+$-type SiC drain regions 21 formed thereon respectively.

In the lateral power MOSFET shown in FIG. 2, if a positive potential is applied to the gate electrode 11 under the condition that a voltage is applied between the drain electrode 13 and the source electrode 12, an n-type inversion layer is formed on a surface of the p-type Si base region 5 directly below the gate electrode 11 and as a result a drain current is passed from the drain electrode 13 to the source electrode 12. Conversely, if the gate electrode 11 is set to 0 V, such n-type inversion layer disappears so that the lateral power MOSFET blocks to flow the drain current. As a result, the lateral power MOSFET is brought into an OFF state.

It has been found that, if a part of the drain regions in the lateral power MOSFET shown in FIG. 2 is formed of SiC semiconductor, a critical electric field $E_c$ can be experimentally given by $$E_c = 1.95 \times 10^4 N_d^{0.131} \qquad (7)$$

An impurity concentration $N_d$ and a thickness of the n-type SiC drain region 20, if exemplified by the power MOSFET of 200 V class, can be obtained as $1.6 \times 10^{17}$ cm$^{-3}$ and 1.2 μm in design respectively. In the structure shown in FIG. 2, an accumulation layer of low resistance is formed by the gate voltage on the surface of the n-type Si drain region 4 just under the gate electrode 11. Therefore, a resistance of this area is negligibly small rather than the resistance of the n-type SiC drain region 20. Hence, it is enough to consider only the resistance of the n-type SiC drain region 20. When the critical electric field $E_c$ is calculated by Eq.(7) and the drain resistance $R_d$ is then calculated by above Eq.(4) under the assumption that the electron mobility $\mu_n$ in SiC bulk is 300 cm$^2$/V·s, a drain resistance $R_d$ of SiC becomes $1.6 \times 10^{-5}$ Ωcm$^2$. It would be understood that, if compared with the resistance $R_d = 3.4 \times 10^{-3}$ Ω cm$^2$ in the power MOSFET made of Si described at the beginning of this disclosure and shown in FIG. 1, such drain resistance can be reduced in two figures. That is to say, it is possible to select the thickness of the wide bandgap drain region 20 so as to ensure the desired source-drain breakdown voltage, and achieve the low on-resistance.

Next, a current OFF state will be discussed hereunder. FIG. 3 is a schematic sectional view showing potential distribution when a high potential is applied between the drain and the source of the lateral power MOSFET shown in FIG. 1. Since the gate electrode 11 is fixed at 0 V, the depletion layer can easily extend from the n$^+$-type Si source region 6 toward the n-type Si drain region 4 immediately below the gate electrode 11. In addition, since a metallurgical junction between the n-type Si drain region 4 and the n-type SiC drain region 20 is put between the gate electrodes 11, a potential in such junction region can be suppressed relatively small. Accordingly, a maximum electric field point is located in the n-type SiC drain region 20 and therefore the on-resistance can be reduced with maintaining the desired source-drain breakdown voltage.

A diffusion coefficient of impurity is low in the SiC semiconductor region. For this reason, a high temperature was required to activate the impurity in the SiC semiconductor and thus it was difficult to form a pn junction in the SiC semiconductor region. However, no problem associated with impurity diffusion in the SiC semiconductor is caused in the present invention since the pn junction is formed in the Si semiconductor region. Thus, manufacture of the lateral power MOSFET according to the first embodiment of the present invention can be made easy.

Next, a method for manufacturing the lateral power MOSFET according to the first embodiment of the present invention will be explained with reference to FIGS. 4A to 4K hereunder.

Figure 4A:
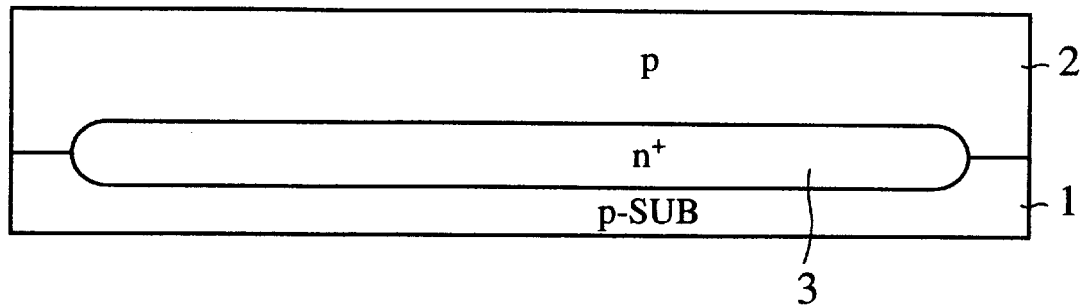
FIGS. 4A to 4K are sectional views showing steps in a method for manufacturing the lateral power MOSFET according to the first embodiment of the present invention.

(a) At first, as shown in FIG. 4A, the high impurity concentration n$^+$-type Si buried layer 3 having an impurity concentration of 10$^{18}$ to 10$^{20}$ cm$^{-3}$ is formed by diffusing antimony (Sb) into a part of the p-type silicon substrate 1 by virtue of solid phase diffusion, for example. Then, according to the vapor phase epitaxial growth method which is performed at 1000 to 1200° C. employing monosilane (SiH$_4$), dichlorosilane (SiH$_2$Cl$_2$), trichlorosilane (SiHCl$_3$) or silicon tetrachloride (SiCl$_4$) as a source gas, hydrogen (H$_2$) as a carrier gas and diborane (B$_2$H$_6$), boron tribromide (BBr$_3$), or the like as a dopant gas, the p-type Si epitaxial layer 2 is formed on the n$^+$-type Si buried layer 3 to have a thickness of 1 μm to several tens μm.

Figure 4B:
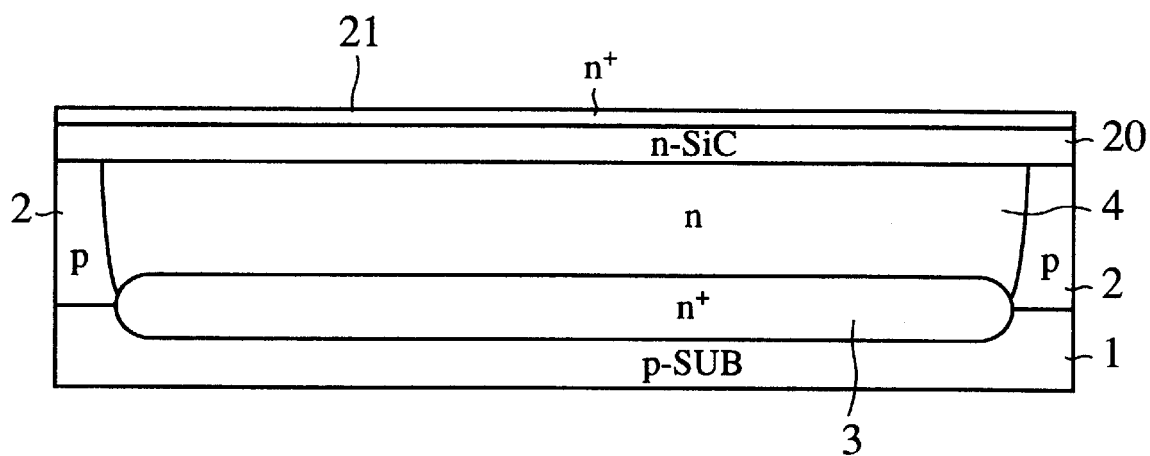

(b) Then, as shown in FIG. 4B, the n-type Si drain region 4 having an impurity concentration of 10$^{14}$ to 10$^{17}$ cm$^{-3}$, for example, is formed by doping n-type impurity into the p-type Si epitaxial layer 2 by virtue of ion implantation, or the like. Then, according to the chemical vapor deposition (CVD) which is carried out at 1200 to 1560° C. employing monosilane (SiH$_4$) and propane (C$_3$H$_8$) as a source gas, and hydrogen (H$_2$) as a carrier gas, for example, the n-type SiC drain region 20 serving as a wide bandgap drain region is formed to have an impurity concentration of 10$^{15}$ to 10$^{18}$ cm$^{-3}$ and a thickness of 0.1 μm to several μm. In addition, the high impurity concentration n$^+$-type SiC drain region 21 serving as a wide bandgap contact region is formed. Nitrogen (N$_2$) may be employed as an n-type dopant introduced into the SiC semiconductor.

Figure 4C:
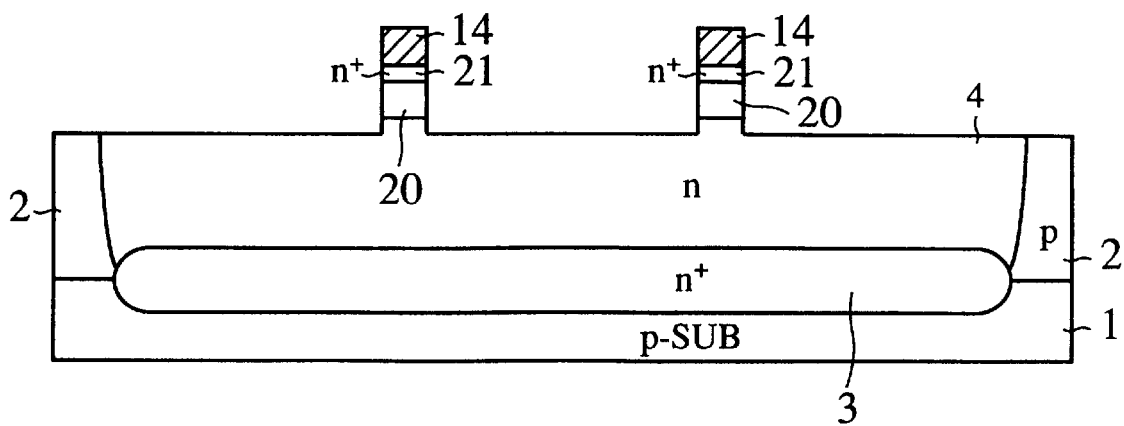

(c) Then, for example, an oxide film 14 is formed on the n$^+$-type SiC drain region 21 by the CVD method, etc. Then, as shown in FIG. 4C, the oxide film 14 is patterned and the n$^+$-type SiC drain region 21 and the n-type SiC drain region 20 are then selectively removed by the reactive ion etching (RIE) using this oxide film 14 as a mask to reach the n-type Si drain region 4. As a result, the n-type SiC drain regions 20 are formed to have a convex shape protruding from the n-type Si drain region 4, each having a cap layer of the n$^+$-type SiC drain region 21.

Figure 4D:
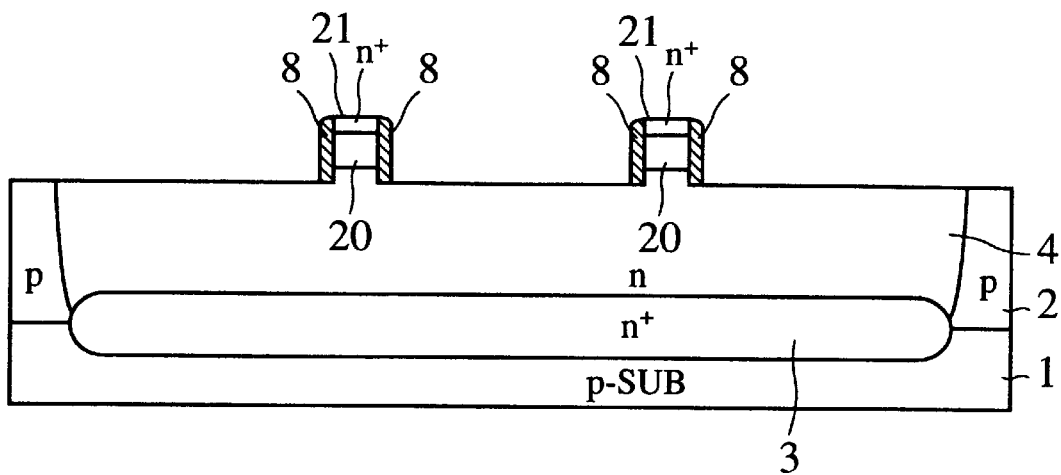
Figure 4E:
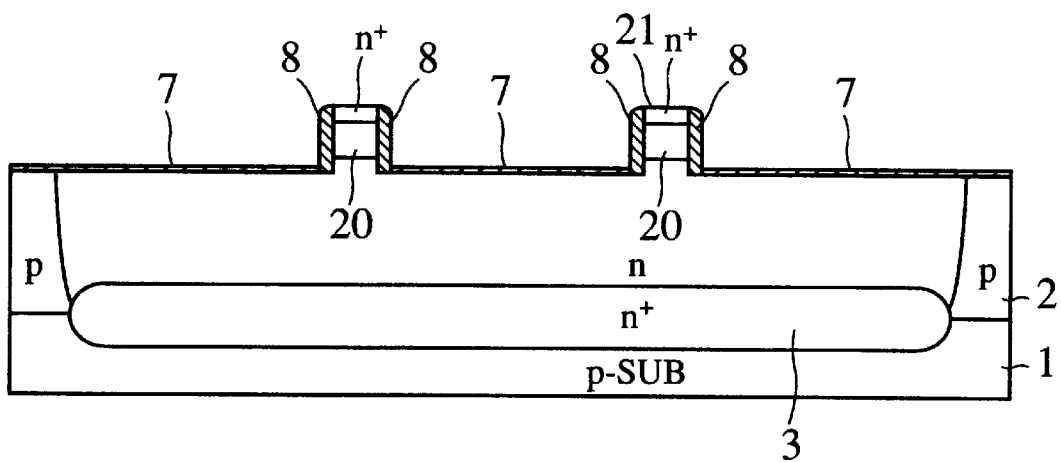
Figure 4F:
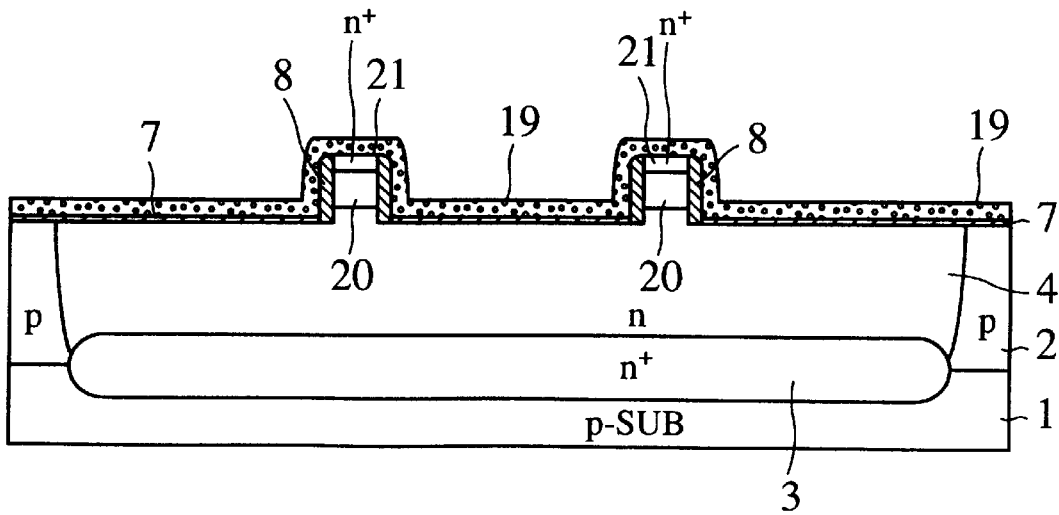

(d) In turn, the insulating film 8 such as the oxide film is formed by the CVD method, etc. on the whole surface of the resultant structure having the convex shape. Then, as shown in FIG. 4D, the insulating films 8 are selectively left by directional etching such as the RIE on both side walls of the convex n-type SiC drain region 20. Subsequently, as shown in FIG. 4E, the gate oxide film 7 of 10 nm to 200 nm thickness, for example, is formed on the surface of the n-type Si drain region 4. In addition, as shown in FIG. 4F, the polysilicon film 19 of 100 nm to 700 nm thickness, for example, is deposited by the CVD method, etc. on the gate oxide film 7.

Figure 4G:
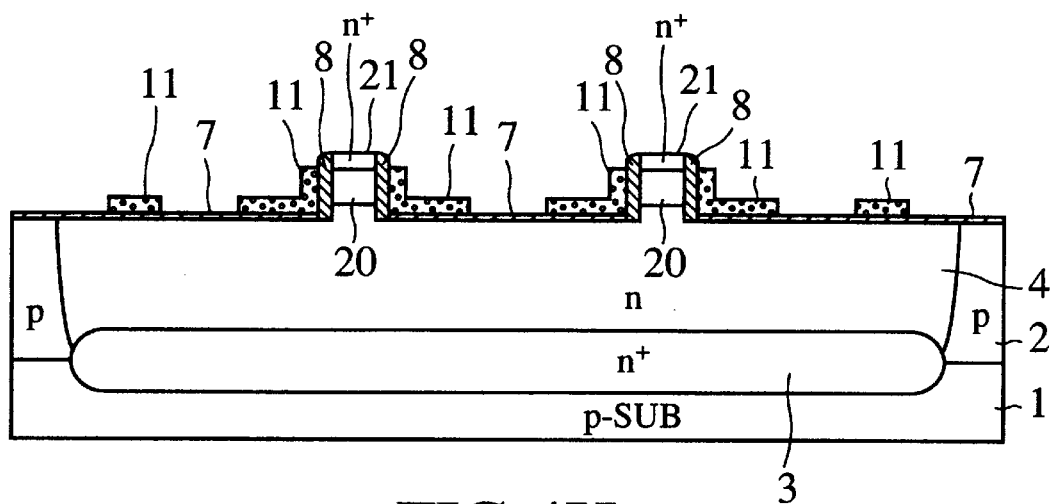
Figure 4H:
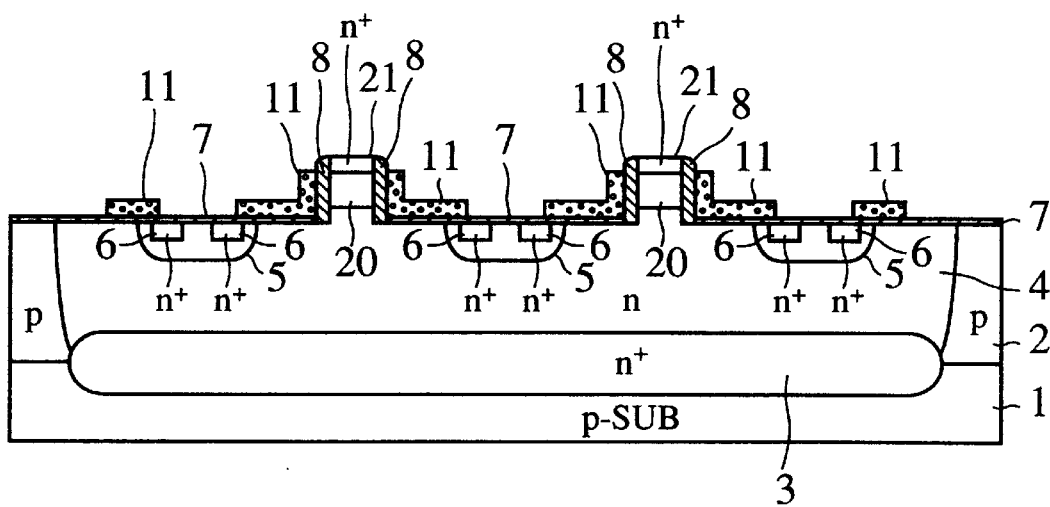

(e) Then, as shown in FIG. 4G, by patterning the polysilicon film 19 in terms of the RIE, etc., the gate electrodes 11 are formed. The polysilicon film 19 is delineated to have diffusion windows for forming the base regions. That is, the gate electrodes 11 act as diffusion masks. Then, as shown in FIG. 4H, the p-type impurity ions such as $^{11}B^+$ are ion-implanted into the n-type Si drain region 4 via the diffusion windows, then the n-type impurity ions such as $^{75}As^+$ are ion-implanted by use of another preselected mask delineating the source pattern as well as the diffusion windows, and then annealing is conducted. According to this double diffusion, the p-type Si base regions 5 each having the depth of 1 $\mu$m to 5 $\mu$m and the impurity concentration of $10^{16}$ to $10^{18}$ cm$^{-3}$, for example, and the high impurity concentration n$^+$-type Si source regions 6 each having the depth of 0.1 $\mu$m to 1 $\mu$m and the impurity concentration of $10^{18}$ to $10^{21}$ cm$^{-3}$, for example, can be formed.

Figure 4I:
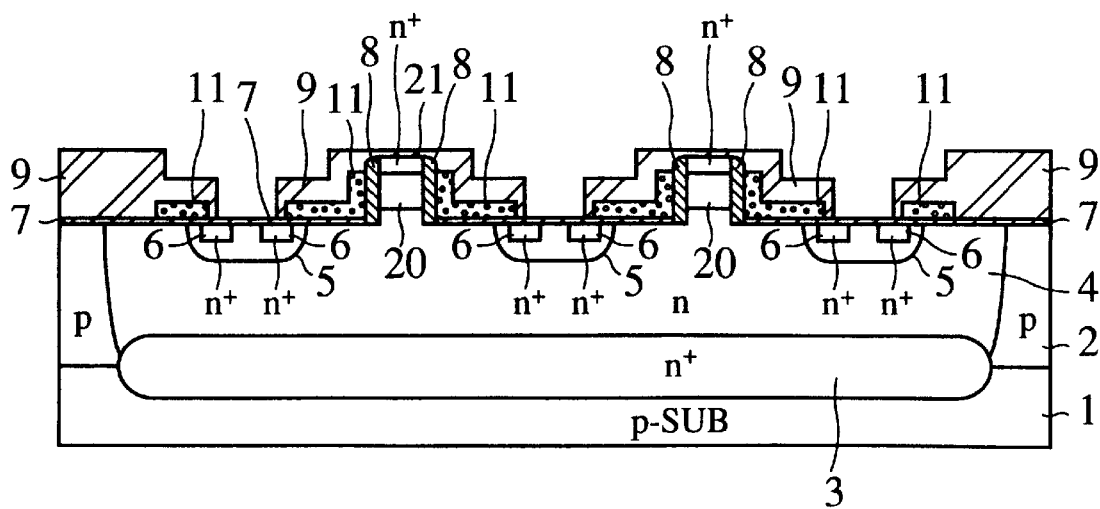
Figure 4J:
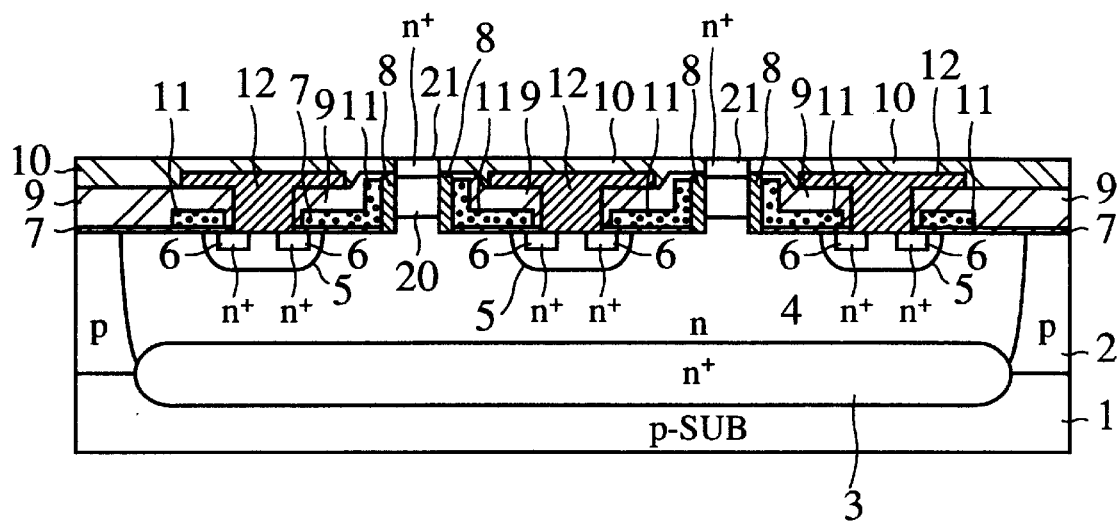
Figure 4K:
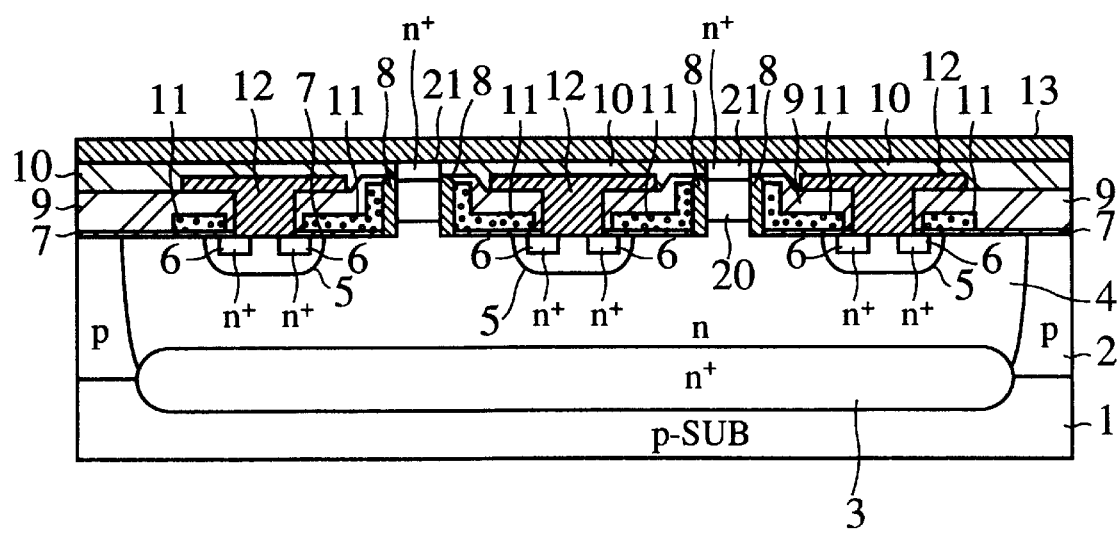

(f) Then, as shown in FIG. 4I, the first interlayer insulating film 9 is formed on surfaces of the gate electrodes 11 and so on, and source contact windows used to form the source electrodes are then formed in the first interlayer insulating film 9. The metal film made of tungsten (W), molybdenum (Mo), aluminum (Al), aluminum-silicon alloy (Al—Si) or the like is then deposited on an overall surface by use of the electron beam (EB) evaporation method or the sputtering method. As shown in FIG. 4J, the source electrodes 12 are then formed by the RIE method, etc. using a preselected mask pattern. After this, the second interlayer insulating film 10 is deposited on an overall surface including the surfaces of the n$^+$-type SiC drain region 21 and the source electrode 12. The second interlayer insulating film 10 is then selectively removed from only the surface areas of the high impurity concentration n$^+$-type SiC drain regions 21 to thus form drain contact windows.

(g) Then, Al, Al—Si, etc. is deposited by the EB evaporation or sputtering on the surface of the second interlayer insulating film 10 to form the drain electrode 13. The high impurity concentration n$^+$-type SiC drain regions 21 formed in the drain contact windows and the drain electrode 13 are connected to each other.

As described above, the lateral power MOSFET having the structure shown in FIG. 2 can be manufactured.

SECOND EMBODIMENT

Figure 5:
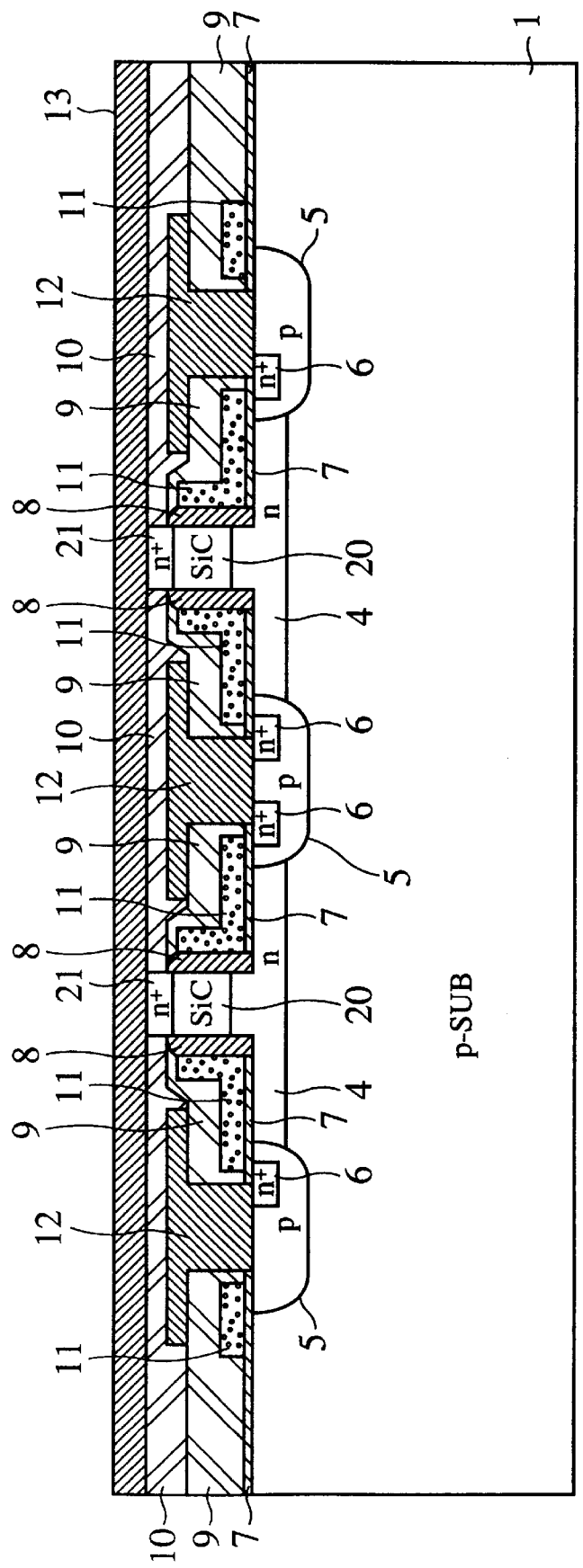
FIG. 5 is a sectional view showing a lateral power MOSFET according to a second embodiment of the present invention.

FIG. 5 is a sectional view showing a lateral power MOSFET according to a second embodiment of the present invention. The lateral power MOSFET employing the p-type Si substrate 1 is shown in FIG. 5. More particularly, in FIG. 5, the p-type Si epitaxial layer 2 and the high impurity concentration n$^+$-type Si buried layer 3 prescribed in the first embodiment (see, FIG. 2) are not provided, but the n-type Si drain regions 4 are formed locally in the vicinity of the surface of the p-type Si substrate 1 so as to be sandwiched by the p-type Si base regions 5. Remaining parts are similar to those in the first embodiment shown in FIG. 2 and therefore the description thereof will be omitted.

In the second embodiment, in the event that a high voltage is applied between the drain and the source in the OFF state, the impurity concentration of the n-type Si drain region 4 is selected so that the depletion layer extending from the base-drain boundary does not reach the n-type SiC drain region 20. Namely, the impurity concentration of the n-type Si drain region 4 is selected so as not to cause "a punch-through" of the depletion layer in the n-type Si drain region 4. If the impurity concentration is selected like this, the high electric field can be prevented from being applied to the Si semiconductor region in the OFF state. As a result, the higher source-drain breakdown voltage can be easily accomplished.

THIRD EMBODIMENT

Figure 6:
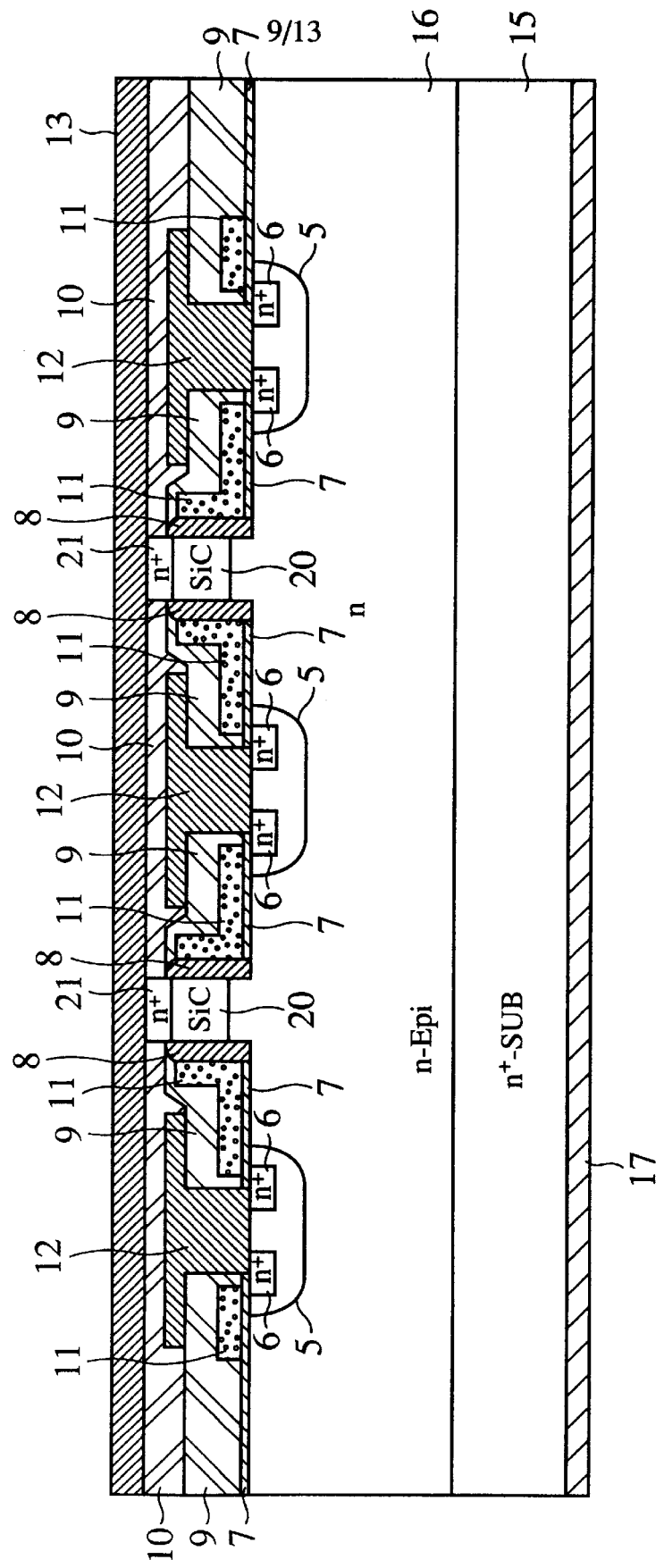
FIG. 6 is a sectional view showing a power MOSFET according to a third embodiment of the present invention.

Subsequently, FIG. 6 is a sectional view showing a power MOSFET according to a third embodiment of the present invention. In FIG. 6, an n-type Si epitaxial layer 16 formed on a high impurity concentration n$^+$-type Si substrate 15 is employed as an n-type Si drain region. And p-type Si base regions 5 are then formed in a surface area of the n-type Si drain region 16. High impurity concentration n$^+$-type Si source regions 6 are then formed in respective p-type Si base regions 5. A gate electrode 11 made of polysilicon is then formed on the p-type Si base region 5 and a part of the n-type Si drain region 4 via the gate oxide film 7. Furthermore, like the first embodiment, convex n-type SiC drain regions 20 are formed on a part of the n-type Si drain region 16. The insulating films 8 are then formed on both sides of the convex n-type SiC drain region 20. Thus, the convex n-type SiC drain region 20 is sandwiched by the gate electrodes 11 via the insulating films 8. High impurity concentration n$^+$-type SiC drain regions 21 are then formed on the surfaces of the n-type SiC drain regions 20 respectively. The first interlayer insulating film 9 is then formed on the gate electrodes 11. The source electrodes 12 are then formed on the first interlayer insulating film 9. The second interlayer insulating film 10 is then formed on the source electrodes 12. The first drain electrode 13 is formed to be isolated by the second interlayer insulating film 10. The n-type SiC drain regions 20 are connected to the first drain electrode 13 via the high impurity concentration n$^+$-type SiC drain regions 21 formed thereon.

Besides, in the power MOSFET according to the third embodiment of the present invention, a second drain electrode 17 is formed on a bottom surface of the high impurity concentration n$^+$-type Si substrate 15 and is connected to the n-type Si drain region 16 via the n$^+$-type Si substrate 15 having a low resistivity.

In the third embodiment, if the second drain electrode 17 and the first drain electrode 13 are connected in operation, the cross-sectional area of current paths becomes wider because the current flows through two drain electrodes 13 and 17, so that the on-resistance can be made lower.

Figure 7:
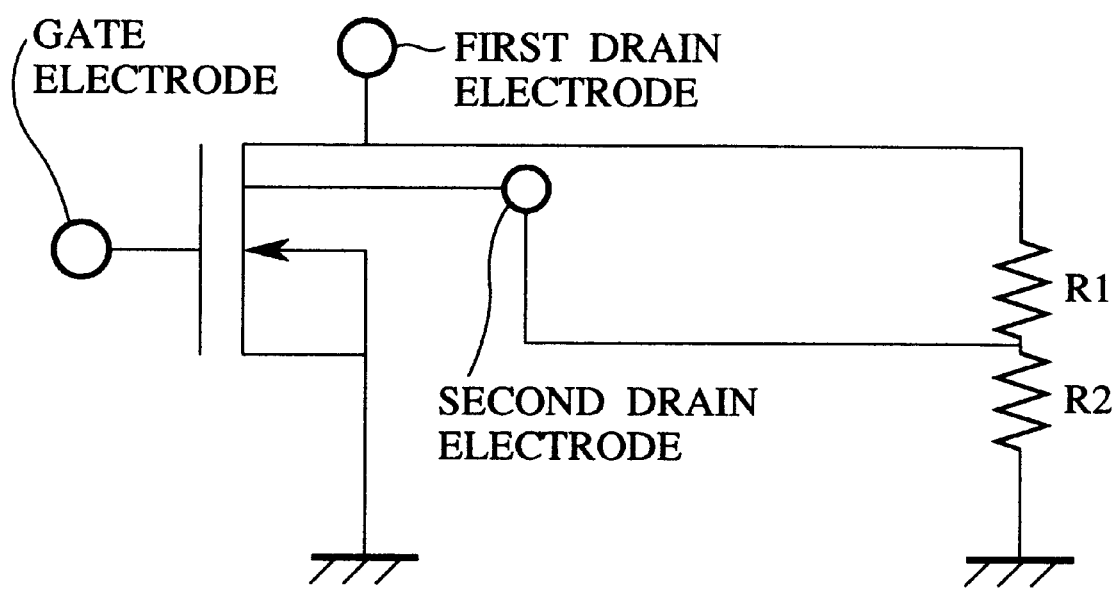
FIG. 7 is a circuit diagram showing an example of an electrode connection method in the power MOSFET according to the third embodiment of the present invention.

In addition, as shown in FIG. 7, if the drain voltage is divided by the resistor R1 and the resistor R2 and then a voltage which is lower than that applied between the first drain electrode and source electrode is applied between the second drain electrode and source electrode, the current mainly passes through the first drain electrode. However, since the n-type Si drain region is connected between the first and second drain electrodes, in which a lower potential than that of between the first drain and source electrodes, the higher breakdown voltage of the power MOSFET is easily obtained.

ANOTHER EMBODIMENT

Figure 8:
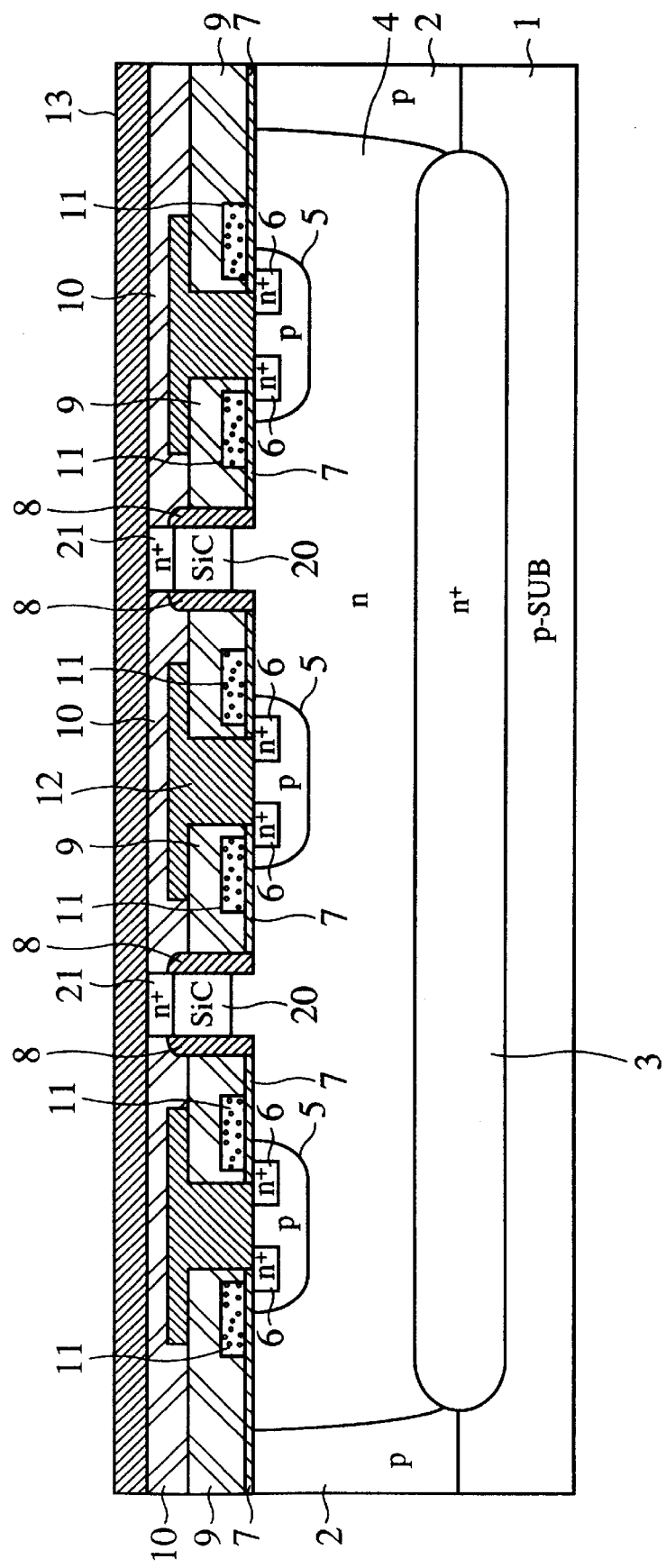
FIG. 8 is a sectional view showing a lateral power MOSFET according to another embodiment of the present invention.
Figure 9:
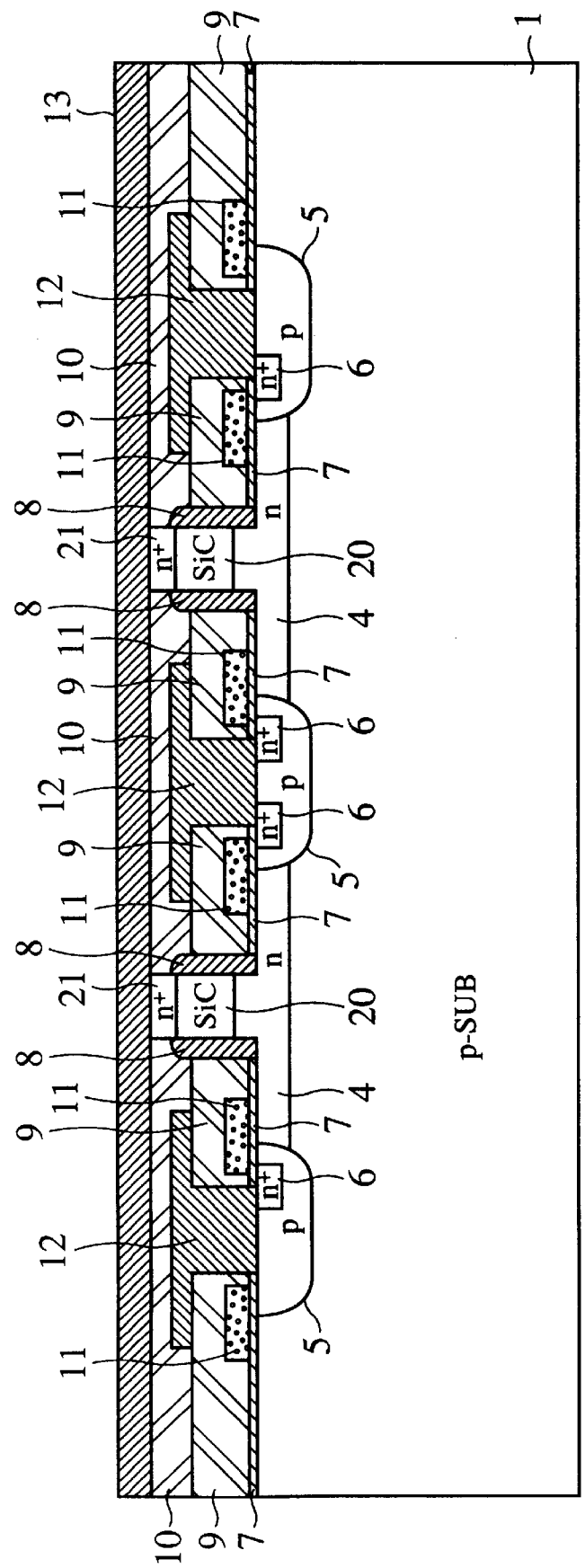
FIG. 9 is a sectional view showing a lateral power MOSFET according to still another embodiment of the present invention.
Figure 10:
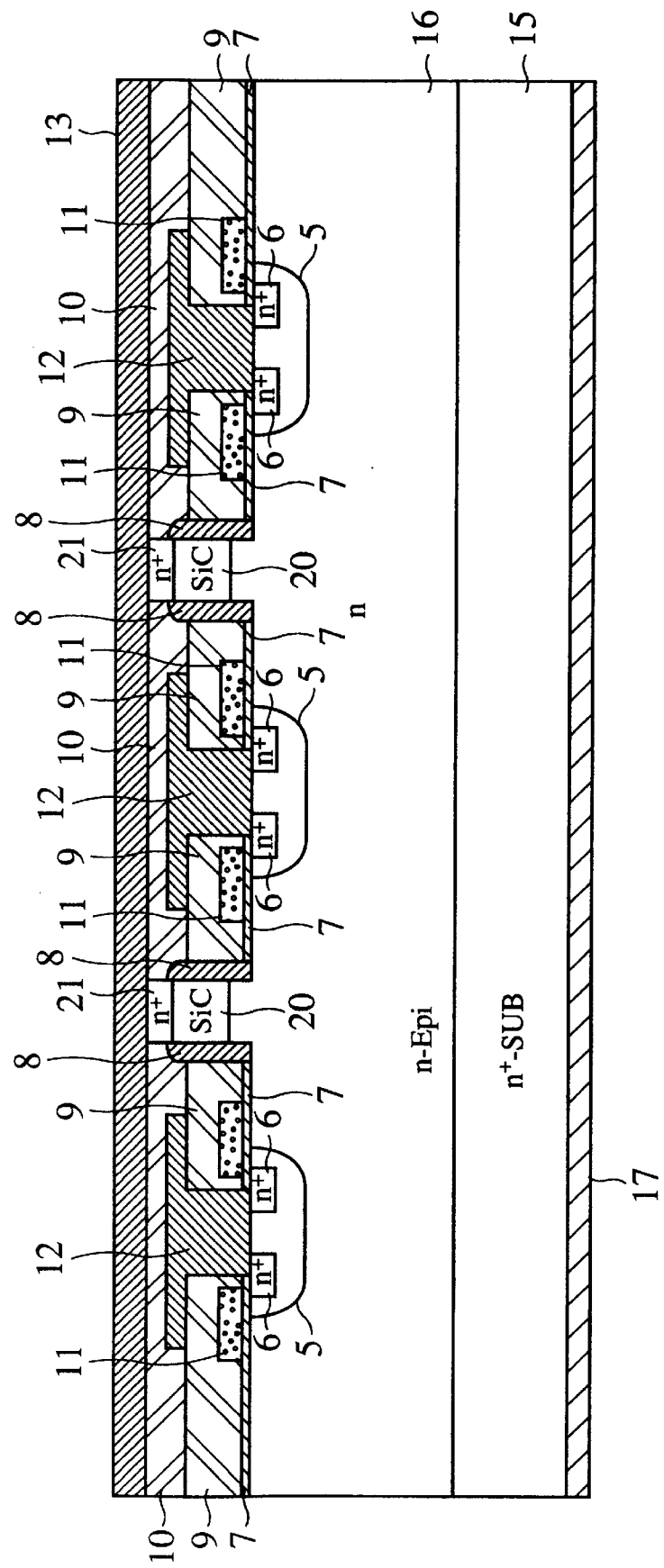
FIG. 10 is a sectional view showing a power MOSFET according to yet still another embodiment of the present invention.

While the first to third embodiments represent the preferred form of the present invention, it is to be understood that another embodiment will occur without departing from the spirit of the invention. Namely, the structures in which a part of the convex drain region is sandwiched by the gate electrodes have been explained in the first to third embodiments, but these structures are mere examples and therefore there is no necessity to always put the convex drain region between the gate electrodes. Therefore, the object of the present invention can be attained by structures shown in FIGS. 8 to 10, in which the gate electrodes 11 are formed locally around the base regions 5. FIGS. 8, 9 and 10 correspond to FIGS. 2, 5 and 6 respectively. According to the structures shown in FIGS. 8 to 10, a gate capacity can be reduced to thus make a higher speed operation possible. And, those skilled in the art will recognize that many variations of such embodiments exist. Such variations are intended to be within the scope of the present invention and the appended claims.

What is claimed is:

1. A power MOSFET having;
   a plurality of base regions;
   source regions formed in the base regions;
   a first drain region of a first semiconductor disposed between the base regions to form a pn-junction between the base and first drain regions, the first drain region having a convex portion; and
   a second drain region of a second semiconductor having a bandgap wider than the first semiconductor disposed on and directly contacted with the convex portion to form a hetero-junction between the first and second semiconductor.

2. The power MOSFET of claim 1, further comprising a drain contact region of the second semiconductor having an impurity concentration higher than that of the second drain region, formed on the second drain region to have a position of the drain contact region higher than that of the source region.

3. The power MOSFET of claim 2, wherein the base regions are formed on a surface of a semiconductor region of opposite conductivity type to that of the base regions, and a buried region of the opposite conductivity type to that of the base regions is formed at a bottom of the semiconductor region which acts as a third drain region.

4. The power MOSFET of claim 2, wherein said semiconductor region is a diffused region disposed in an epitaxial layer, the epitaxial layer having the same conductivity type as that of the base regions to form a pn-junction between said semiconductor region and said epitaxial layer.

5. The power MOSFET of claim 2, wherein the base regions are formed on a surface of a semiconductor substrate of an opposite conductivity type to that of the base regions.

6. The power MOSFET of claim 1, wherein the base regions are formed on a surface of an epitaxial layer formed on a top surface of a high impurity concentration substrate of opposite conductivity type to that of the base regions, a first drain electrode is formed on a top portion of the second drain region, source electrodes are formed on the source regions, and a second drain electrode is formed on a bottom surface of the high impurity concentration substrate.

7. The power MOSFET of claim 6, wherein a voltage applied between the second drain and source electrodes is lower than that applied between the first drain and source electrodes.

8. The power MOSFET of claim 1, wherein the second semiconductor is formed of silicon carbide (SiC) and the first semiconductor is formed of silicon (Si).

9. A power MOSFET having a plurality of base regions, source regions formed in the base regions and a drain region formed between the base regions,
   wherein the drain region has a convex portion and at least a part of the convex portion is formed of a wide bandgap semiconductor which has a wider bandgap rather than another portion of the drain region, the base regions are formed on a surface of an epitaxial layer which is formed on a top surface of a high impurity concentration substrate of opposite conductivity type to that of the base regions, a first drain electrode is formed on a top portion of the convex portion, source electrodes are formed on the source regions respectively, and a second drain electrode is formed on a bottom surface of the high impurity concentration substrate.

10. The power MOSFET of claim 9, wherein a voltage applied between the second drain and source electrodes is lower than that applied between the first drain and source electrodes.

11. The power MOSFET of claim 9, wherein the wide bandgap semiconductor comprises a high impurity concentration region serving as a wide bandgap contact region and a wide bandgap drain region having an impurity concentration which is lower than that of the wide bandgap contact region.

12. A power MOSFET having a plurality of base regions, source regions formed in the base regions and a drain region formed between the base regions,
   wherein the drain region has a convex portion, sandwiched in between gate electrodes via insulating films, and at least a part of the convex portion is formed of a wide bandgap semiconductor which has a wider bandgap rather than another portion of the drain region.

13. The power MOSFET of claim 12, wherein the base regions are formed on a surface of a semiconductor region of opposite conductivity type to that of the base regions, and a buried drain region of the opposite conductivity type to that of the base regions is formed at a bottom of the semiconductor region which acts as a part of the drain region.

14. The power MOSFET of claim 12, wherein the base regions are formed on a surface of a semiconductor region of conductivity type opposite to that of the base regions, and a buried drain region of the opposite conductivity type to that of the base regions is formed at a bottom of the semiconductor region which acts as a part of the drain region.

15. The power MOSFET of claim 13, wherein said semiconductor region is a diffused region disposed in an epitaxial layer, the epitaxial layer having the same conductivity type as that of the base regions to form a pn-iunction between said semiconductor region and said epitaxial layer.

16. The power MOSFET of claim 12, wherein the base regions are formed on a surface of a semiconductor substrate of opposite conductivity type to that of the base regions.

17. The power MOSFET of claim 12, wherein the base regions are formed on a surface of a semiconductor substrate of opposite conductivity type to that of the base regions.

18. The power MOSFET of claim 12, wherein the base regions are formed on a surface of an epitaxial layer which is formed on a top surface of a high impurity concentration substrate of opposite conductivity type to that of the base regions, a first drain electrode is formed on a top portion of the convex portion, source electrodes are formed on the source regions respectively, and a second drain electrode is formed on a bottom surface of the high impurity concentration substrate.

19. The power MOSFET of claim 18, wherein a voltage applied between the second drain and source electrodes is lower than that applied between the first drain and source electrodes.

20. The power MOSFET of claim 12, wherein the wide bandgap semiconductor comprises a high impurity concentration region serving as a wide bandgap contact region and a wide bandgap drain region having an impurity concentration which is lower than that of the wide bandgap contact region.

21. The power MOSFET of claim 12, wherein the wide bandgap semiconductor is formed of silicon carbide (SiC) and the other portion is formed of silicon (Si).

* * * * *